United States Patent [19]

Houghton

[11] 4,338,532

[45] Jul. 6, 1982

[54] INTEGRATED DELAY CIRCUITS

[75] Inventor: Russell J. Houghton, Essex Junction, Vt.

[73] Assignee: International Business Machines Corp., Armonk, N.Y.

[21] Appl. No.: 99,148

[22] Filed: Nov. 30, 1979

[51] Int. Cl.³ .......................... H03K 5/13; H03K 3/33
[52] U.S. Cl. .................................. 307/590; 307/605; 307/300; 307/317 A; 357/35
[58] Field of Search ............... 307/590, 605, 300, 280, 307/317 A; 357/35

[56]         References Cited
        U.S. PATENT DOCUMENTS

| | | | |
|---|---|---|---|
| 3,466,469 | 8/1966 | Brown | 307/590 |
| 3,585,412 | 8/1968 | Hodges et al. | 307/317 A |
| 3,641,369 | 2/1972 | Wallingford | 307/605 |
| 3,701,119 | 12/1971 | Waaben et al. | 307/281 |
| 3,877,823 | 12/1973 | Nikami | 307/590 |
| 3,991,322 | 6/1976 | Bush et al. | 307/304 |
| 4,005,451 | 1/1977 | Martinelli et al. | 357/35 |
| 4,013,898 | 1/1977 | Makino | 307/299 B |

Primary Examiner—Stanley D. Miller, Jr.
Assistant Examiner—B. P. Davis
Attorney, Agent, or Firm—Stephen J. Limanek

[57]  ABSTRACT

An integrated delay circuit has been provided which comprises a bipolar transistor and more particularly a PNP transistor having a diffusion capacitor of a given storage capacity as a time delay element and means including a switching device coupled to the junction capacitor for controlling current flow through the transistor. The switching device, which is preferably a Schottky diode, includes a capacitor having a charge storage capacity less than, and preferably substantially less than, that of the transistor. In the closed condition of the switching device a constant or steady current is sustained through the transistor and in the opened condition of the switching device the current through the transistor decreases exponentially. By coupling the output current from the transistor to a current level detector or comparator controlled delay times of substantial duration are produced in bipolar circuit technology.

14 Claims, 5 Drawing Figures

INTEGRATED DELAY CIRCUITS

TECHNICAL FIELD

This invention relates to integrated semiconductor circuits and more particularly to long controlled time delay circuits produced in bipolar circuit technology.

BACKGROUND ART

Time delay circuits are well known in the art, but circuits for producing long delays in bipolar circuit technology are difficult to achieve, requiring complex circuitry or processes.

U.S. Pat. No. 3,991,322, filed June 30, 1975, describes a delay circuit utilizing bucket brigade and sample and hold circuits requiring timing pulses.

In U.S. Pat. No. 3,466,469, filed Aug. 19, 1966, a circuit is taught which includes a timing capacitor connected to a PNP-NPN transistor pair with means for providing a linear discharge of the capacitor. Regenerative action of the transistor pair provides an indication of the end of the timing period.

U.S. Pat. No. 3,887,823, filed Dec. 18, 1973, discloses a pulse delay circuit including a differential amplifier having a resistor-capacitor time constant circuit connected to the base of one of the amplifier transistors.

DISCLOSURE OF INVENTION

It is an object of this invention to provide an improved delay circuit for integrated circuits.

It is another object of this invention to provide an improved delay circuit when uses a small amount of semiconductor substrate surface area and low power.

It is still another object of this invention to provide an improved long controlled time delay circuit in bipolar circuit technology.

It is yet another object of this invention to provide an improved delay circuit which utilizes the time constant of a transistor as the delay determining element, and particularly the large time constant of a lateral PNP transistor.

In accordance with the teachings of this invention, an integrated delay circuit is provided which includes a bipolar transistor having coupled thereto means for producing a stored charge therein for sustaining transistor current and switching means coupled to the base of the transistor which when actuated substantially inhibit any conduction from the base of the transistor through the switching means. The switching means is characterized by being capable of supporting less stored charge therein than is supported in the transistor. When the switching means is actuated so as to inhibit conduction, the current flowing between the emitter and collector of the transistor decreases exponentially. By introducing this transistor current into a current level detector or into one side of a comparator, with the other side of the comparator being provided with a reference current, an output pulse is produced having a controlled time delay from the time of actuation of the switching means. In one embodiment of the invention, the transistor is preferably a PNP transistor which is capable of supporting a large stored charge in its base region for providing long delay times and the switching means includes a Schottky diode which supports a considerably smaller amount of stored charge than does a PNP transistor.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
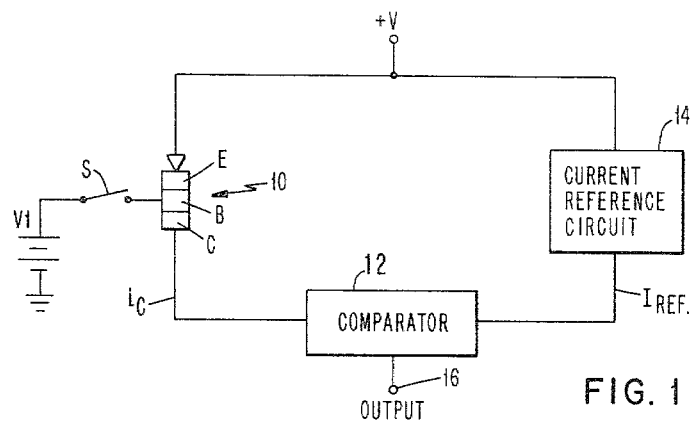
FIG. 1 is a circuit diagram, partly in block form, illustrating an embodiment of the present invention.

Referring to FIG. 1 of the drawing in more detail, there is illustrated a circuit diagram, partly in block form, of an embodiment of the integrated delay circuit of the present invention. The circuit includes a transistor 10, of the PNP type having an emitter E connected to a supply voltage terminal +V, a collector C connected to one side of a comparator 12 and a base B connectable through a switch S to a voltage source V1, preferably having a voltage magnitude equal to +V minus the forward base-emitter voltage $V_{BE}$ of transistor 10. A current reference circuit 14 which produces a reference current $I_{REF}$ is connected between the supply voltage terminal +V and the other side of comparator 12. An output terminal for comparator 12 is indicated at 16.

Figure 2:
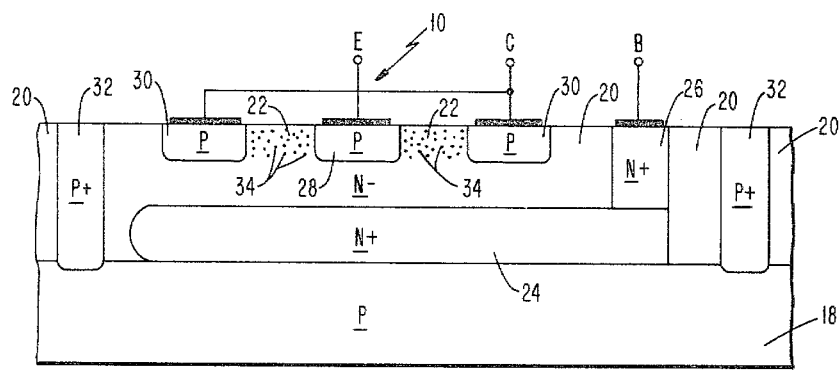
FIG. 2 is a sectional view taken through a semiconductor substrate containing a PNP transistor which may be used in the circuit of FIG. 1 of the drawings.

In FIG. 2 of the drawing, there is shown a sectional view of the transistor 10 of FIG. 1 of the drawing formed on a P type substrate 18 within an N-type epitaxial layer 20, a region 22 of which forms the base B of the transistor. Contact to base region 22 is made through N+ buried zone 24 via N+ reach-through zone 26. P type emitter and collector regions of transistor 10 are illustrated at 28 and 30, respectively, wherein collector region 30 encloses emitter region 28, as well as base region 22. A P+ isolation zone surrounding transistor 10 and extending to the P type substrate 18 is indicated at 32.

Figure 3:
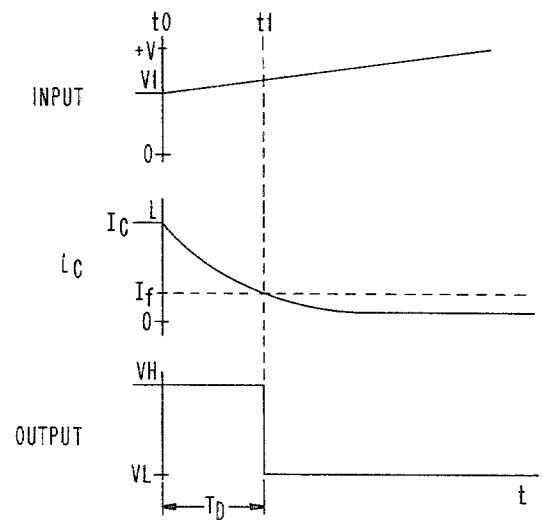
FIG. 3 is a pulse program indicating voltage and current relationships in the embodiment illustrated in FIG. 1.

The operation of the integrated delay circuit of FIG. 1 may best be understood by referring to the pulse program illustrated in FIG. 3. With the switch S closed, a voltage V1 is applied to the base B of transistor 10 and a current $i_C$ through transistor 10 assumes a steady state current value of $I_C$ which flows from the collector C into one side of comparator 12. With reference current $I_{REF}$ flowing into the opposite side of comparator 12, it can be assumed that the output voltage at terminal 16 has a high value VH, as indicated in FIG. 3 of the drawings. During this steady state condition, as is known, charge 34, as indicated in FIG. 2 of the drawing, is stored in the base region 22. This stored charge in the base region 22 can be considered as charge stored in a diffusion capacitor. When the switch S is opened at time t0, i.e., when the applied voltage from voltage source V1 is removed from the base B, current flow through transistor 10 continues to be supported by the stored charge 34 in the base region 22 but at a continuously decreasing rate dependent upon the amount of charge remaining in base region 22, as the voltage at the base B increases towards +V. The decreasing rate of current $i_C$ is exponential, as indicated in FIG. 3 of the drawing, and follows the relationship $e^{-t/\tau}$, where t is time and $\tau$ is the time constant of the transistor, where $\tau \propto \beta/f_T$, with $\beta$ being the current gain and $f_T$ being the cut off frequency of the transistor. It can be seen that it is desirable in this circuit to build transistor 10 with a low cut off frequency or a large amount of charge to increase delay times. A transistor having a low cut off frequency or a large amount of stored charge can be conveniently produced by making a lateral PNP transistor, as is indicated in FIG. 2 of the drawing. The stored charge in transistor 10 can be increased by, e.g., increasing the width of base region 22.

By an appropriate selection of circuit parameters in comparator 12, the output voltage at terminal 16 can be made to assume its lower voltage value VL at a predetermined current value along curve $i_C$ of FIG. 3, such as at $I_f$, which occurs at time t1 to produce the delay time of $T_D$.

It should be noted that by providing a switch S at the base B of transistor 10 with no or minimal leakage or with only a small capacitance when in its open position, the charge in base region 22 is not substantially disturbed by switch S and, therefore, the initial value of $I_C$ relative to $I_f$ is maintained, thus providing greater accuracy of delay time $T_D$.

It can be seen that by isolating the stored charge in the base region from circuitry that may be connected to the base region during steady state operation of the transistor, the initial stored charged in the transistor itself can be used as the delay determining mechanism of the delay circuit.

Figure 4:
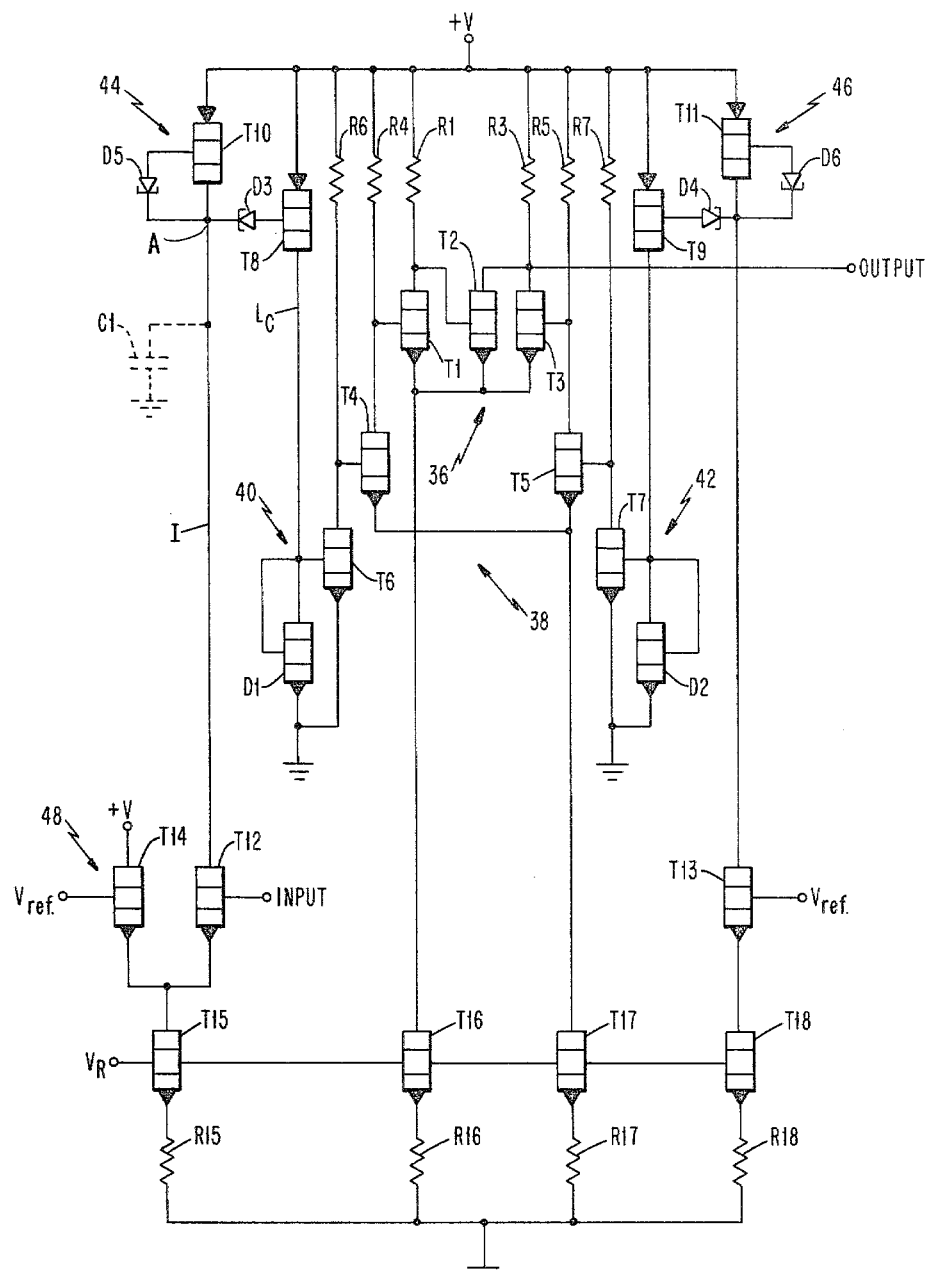
FIG. 4 is a detailed circuit diagram of an integrated delay circuit of the present invention.

In FIG. 4 there is shown a detailed circuit of an integrated delay circuit of the present invention. This circuit comprises a latch 36 including transistors T1, T2 and T3 along with resistor R1 connecting supply voltage terminal +V to transistor T1 and resistor R3 connected to transistor T2 and T3. An output terminal is connected to the collectors of transistors T2 and T3. A differential amplifier 38 includes transistors T4 and T5 connected through resistors R4 and R5, respectively, to supply voltage terminal +V. A first current amplifier 40 includes transistor T6 and diode D1 with resistor R6 connecting transistor T6 to supply voltage terminal +V. A second current amplifier 42 includes transistor T7 and diode D2 with resistor R7 connecting transistor T7 to supply voltage terminal +V. The latch 36, the differential amplifier 38 and the first and second current amplifiers make up a comparator for which any suitable known comparator may be substituted.

A first time delay determining PNP transistor T8 is connected between the base of transistor T6 of the first current amplifier 40 and supply voltage terminal +V and a second substantially identical PNP transistor T9 is connected between the base of transistor T7 of the second current amplifier 42 and supply voltage terminal +V. A first switching circuit 44 includes a PNP transistor T10, connected at its emitter to supply voltage terminal +V, a Schottky diode D3 connected between the collector of PNP transistor T10 and the base of PNP transistor T8, and a Schottky diode D5 connected between the base and collector of PNP transistor T10. A second switching circuit 46 includes a PNP transistor T11 connected at its emitter to supply voltage terminal +V, a Schottky diode D4 connected between the collector of PNP transistor T11 and the base of PNP transistor T9, and a Schottky diode D6 connected between the base and collector of PNP transistor T11.

An input circuit 48 includes transistors T12 and T14 connected as a current switch, with the base of transistor T14 being connected to a reference voltage terminal $V_{ref}$ and its collector being connected to supply voltage terminal +V and with the base of transistor T12 being connected to an input terminal and its collector being connected to the collector of the PNP transistor T10 of the first switching circuit 44. A transistor T13, substantially identical to transistor T12, has its base connected to reference voltage terminal $V_{ref}$ and its collector connected to the collector of the PNP transistor T11 of the second switching circuit 46 to provide matching of currents at transistor T12 and T13 collectors when the input is high.

A current source 52 includes transistors T15, T16, T17 and T18 having their emitters coupled to ground through resistors R15, R16, R17 and R18, respectively, and a reference circuit $V_R$ connected to the base of each of the transistors T15, T16, T17 and T18. Input circuit 48 is connected to the current source 52 at the collector of transistor T15, latch 36 is connected to the current source 52 at the collector of transistor T16, differential amplifier 38 is connected to the current source 52 at the collector of transistor T17, and transistor T13 is connected to the current source 52 at the collector of transistor T18.

Figure 5:
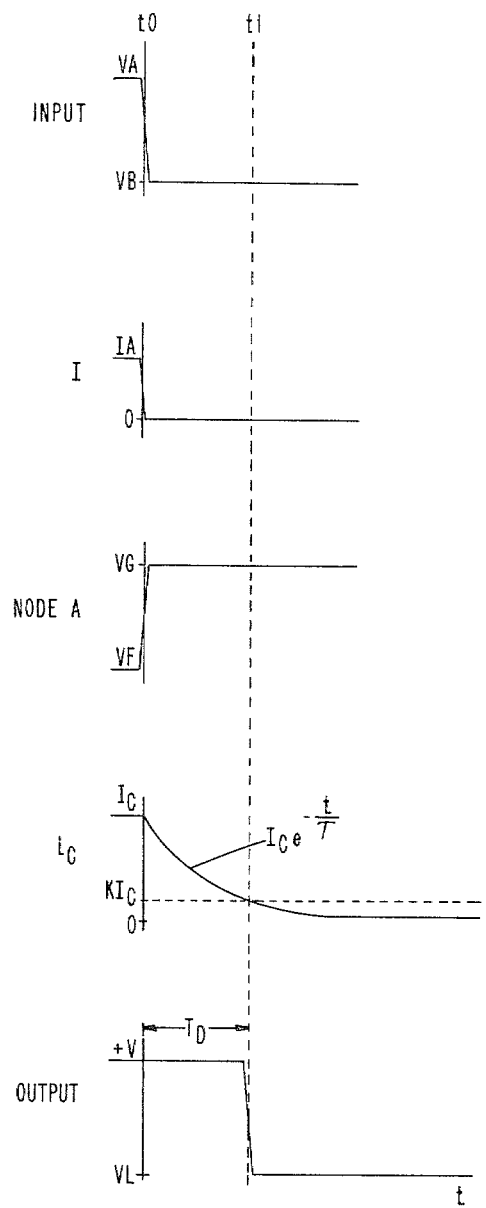
FIG. 5 is a pulse program indicating voltage and current relationships in the circuit illustrated in FIG. 4.

The operation of the integrated delay circuit of FIG. 4 may best be understood by referring to the pulse program illustrated in FIG. 5 of the drawing. When the input is at a positive voltage VA, current IA flows through transistor T12 with the voltage at node A being VF which is equal to $+V-(V_{BE}+V_{SF})$, where +V is the voltage at the supply voltage terminal +V, $V_{BE}$ is the base-emitter voltage of either of the similar PNP transistors T8 and T10 and $V_{SF}$ is the forward voltage drop across either of the similar Schottky diodes D3 and D5. Under these conditions the current at the collector of PNP transistor T8 is equal to $I_C$. The current flowing at the collector of transistor T6 is directly proportional to current IA as a result of current mirror action by the combination of PNP transistors T8 and T10, Schottky diodes D3 and D5 and amplification by transistor T6 with diode D1. Circuits exhibiting mirror action are well known and are, e.g., described in U.S. Pat. No. 4,013,898, filed Jan. 14, 1976. A voltage equal to $+V-IR6$ is established at the base of transistor T4 of the differential amplifier 38, where IR6 is the voltage drop through resistor R6. With current flowing at the collector of transistor T13, the base of transistor T5 is at +V minus the voltage drop across resistor R7 and the output voltage at the collectors of transistors T2 and T3 of latch 36 is at its high value +V.

As the input voltage is switched to a more negative value VB, the current IA is shifted to transistor T14 of the input circuit 48, with the current at the collector of transistor T12 being reduced to zero and the voltage at node A increasing to VG which is equal to $+V-V_{SAT}$, where $V_{SAT}$ is the voltage across transistor T10 when the current through transistor 12 is zero. As can be seen from FIG. 5 of the drawings, the current $i_C$ at the collector of transistor T8 now begins to decrease exponentially due to the decreasing stored charge in the base of transistor T8, as discussed hereinabove in connection with the charge stored in transistor 10 of FIGS. 1 and 2 of the drawings. The exponential decrease in the current $i_C$ is similar to that described hereinabove and is equal to $I_C e^{-t/\tau}$.

It should be noted that this exponential decrease is brought about by the switching circuit 44 which includes the Schottky diodes D3 and D5 and transistor T10. The Schottky diodes have virtually no stored charge and a very small junction capacitance. With Schottky diode D3 reverse biased when the voltage at node A is raised to $+V-V_{SAT}$ volts only a small percent of the stored charge in the base of PNP transistor T8 is removed. Thus, the initial emitter current in transistor T8 is reduced only by a negligible amount. Furthermore, the stored charge in transistor T10 provides the drive necessary to quickly raise the voltage at node A, which has only a small parasitic capacitor C1, so that diode D3 is reverse biased very fast. The use of Schottky barrier diodes as high impedance elements and as self-opening switches is known in the prior art, as, e.g., in U.S. Pat. No. 3,585,412, filed Aug. 27, 1968 and U.S. Pat. No. 3,701,119, filed Dec. 30, 1971.

By using the combination of diode D1 and transistor T6 a constant voltage is provided at the collector of transistor T8. This constant voltage is desirable in order to prevent the exponential response of the PNP transistor T8 from being modified by charge transfer through the collector-base junction capacitance of PNP transistor T8. The time constant of the diode D1-transistor T6 combination is very fast compared to the PNP time constant of transistor T8 and, therefore, the time constant of the collector current of transistor T6 is the same as the PNP time constant of transistor T8. The voltage at the base of transistor T4 as a function of time is $$+V = IR6\, e^{-\frac{\beta_{PNP}+1}{\omega_{TPNP}} t},$$

where $\beta_{PNP}$ is the current gain and $\omega_{TPNP}$ is equal to $2\pi f_T$ of transistor T8 and t is time.

The combination of PNP transistors T9 and T11 and Schottky diodes D4 and D6 is made substantially identical to PNP transistors T8 and T10 and Schottky diodes D3 and D5 to provide matching combinations.

The circuit output voltage goes negative when the latch 36 is switched at time t1, as indicated in FIG. 5 of the drawing, after the delay time $T_D$ and occurs when the bases of transistors T4 and T5 are at equal potential, which is determined by the ratio R6/R7 and the PNP turn off time constant $(\beta_{PNP}+1)/\omega_{TPNP}$ of transistor T8, and the current $i_C$ is equal to $KI_C$, where K is related to the ratio of resistors R6 and R7.

It can be seen that the integrated delay circuit of the present invention has the advantage of being able to generate a long well controlled time delay on an integrated circuit substrate or chip within a small area and with low power. Substantially the only chip process parameters affecting the delay $T_D$ chosen by the R6/R7 ratio is the $\beta/f_T$ ratio of the lateral PNP transistor T8. It should be noted that the delay time $T_D$ is equal to $$\frac{\beta_{PNP} + 1}{\omega_{TPNP}} \ln \frac{R6}{R7}.$$

It should also be noted that this delay circuit is particularly suitable for use with dynamic bipolar memory circuits where PNP time constant tracking is desired, such as when latch setting time delays of 50 nanoseconds or more are required after a chip of a memory system, such as that disclosed in U.S. Patent application Ser. No. 866,126, entitled "Bipolar Two Device Dynamic Memory Cell," filed on Dec. 30, 1977, by B. El-Kareh, J. E. Gersbach and R. J. Houghton, now U.S. Pat. No. 4,181,981, has been selected.

It should also be noted that although PNP transistors have been disclosed as the delay elements in the circuit of the present invention, NPN transistors may also be used but they will produce shorter delay times due to the stored charge characteristics of the NPN transistor. Regardless of what type transistor is used as the delay element, the switching means connected to the base of the transistor should contain substantially less stored charge than that of the transistor being controlled.

While the invention has been particularly shown and described with reference to preferred embodiments thereof, it will be understood by those skilled in the art that various changes in form and details may be made therein without departing from the spirit and scope of the invention.

What is claimed is:

1. A delay circuit comprising
   a bipolar transistor including first and second electrodes and a base region having a given charge storage capacity, said first electrode being connected to a first point of fixed potential,
   means for supplying current through said transistor to charge said base region,
   means including a switching device coupled to said base region for controlling the current flow through said transistor,
   and
   means having an input connected to said second electrode and to a second point of substantially fixed potential responsive to a predetermined magnitude of said current, said switching device having a charge storage capacity substantially less than that of the base region of said transistor, a closed condition for sustaining said current in said transistor in a steady state and an open condition for interrupting current flow in said transistor,
   whereby the current flow through said transistor decreases exponentially when said switching device is in the open condition.

2. A delay circuit as set forth in claim 1 wherein said bipolar transistor is a PNP transistor.

3. A delay circuit as set forth in claim 2 wherein said bipolar transistor is a lateral PNP transistor.

4. A delay circuit comprising
   a bipolar transistor including a base region having a given charge storage capacity,
   means including a switching device coupled to said base region for controlling current flow through said transistor, and
   means responsive to a predetermined magnitude of said current, said switching device including a Schottky barrier diode and having a charge storage capacity less than that of said transistor, a closed condition for sustaining said current in said transistor in a steady state and an open condition for interrupting current flow in said transistor,
   whereby the current flow through said transistor decreases exponentially when said switching device is in the open condition.

5. A delay circuit as set forth in claim 4 wherein said bipolar transistor is a lateral PNP transistor and said switching device includes a Schottky diode.

6. A delay circuit as set forth in claim 4 wherein said bipolar transistor is a PNP transistor and said means for controlling the current flow includes a voltage source and a second transistor coupled between said voltage source and said switching device.

7. A delay circuit as set forth in claim 6 wherein said means for controlling the current flow further includes a first Schottky diode connected between the base and collector of said second transistor, said second transistor being a PNP transistor and said switching device being a second Schottky diode.

8. A delay circuit as set forth in claim 7 wherein said bipolar transistor and said second transistor each have an emitter coupled to said voltage source and the first and second diodes have their cathodes connected to a common point and wherein said means for controlling the current flow further includes a pulse source coupled to said common point.

9. An integrated delay circuit comprising
a bipolar transistor having a diffusion capacitor of a given charge storage capacity,
means for supplying current through said transistor,
means including a switching device coupled to said diffusion capacitor for controlling the current flow through said transistor, said switching device including a capacitor having a charge storage capacity substantially less than that of said given capacity, a closed condition for sustaining a constant current in said transistor and an open condition for decreasing the current flow in said transistor,
a constant voltage source,
a comparator having first and second input terminals and an output terminal, said first terminal being disposed at a point of substantially fixed potential and said transistor being coupled between said voltage source and said first input terminal, and
a current reference circuit coupled between said voltage source and said second input terminal.

10. An integrated delay circuit comprising
a first PNP bipolar transistor having a diffusion capacitor of a given charge storage capacity,
means including a switching device coupled to said diffusion capacitor for controlling current flow through said transistor, said switching device including a first Schottky diode and a capacitor having a charge storage capacity substantially less than that of said given capacity, a closed condition for sustaining a constant current in said transistor and an open condition for decreasing the current flow in said transistor,
a voltage source,
a comparator having first and second input terminals and an output terminal, said transistor being coupled between said voltage source and said first input terminal, and
a current reference circuit coupled between said voltage source and said second input terminal.

11. An integrated delay circuit as set forth in claim 10 wherein said current controlling means further includes a second PNP transistor connected between said voltage source and said Schottky diode.

12. An integrated delay circuit as set forth in claim 11 wherein said current controlling means further includes a second Schottky diode connected between the base and collector of said second PNP transistor.

13. An integrated delay circuit as set forth in claim 12 wherein said first and second PNP transistor each have an emitter coupled to said voltage source and the first and second diodes have their cathodes connected to a common point and wherein said current controlling means further includes a pulse source coupled to said common point.

14. An integrated delay circuit as set forth in claim 13 wherein said comparator includes a latch coupled to said output terminal, a differential amplifier coupled to said latch and first and second current amplifiers coupled to said differential amplifier, the input of said first current amplifier being coupled to the collector of said first PNP transistor and the input of said second current amplifier being connected to said current reference circuit.

* * * * *